United States Patent [19]

Ecker et al.

[11] 4,251,852
[45] Feb. 17, 1981

[54] INTEGRATED CIRCUIT PACKAGE

[75] Inventors: Mario E. Ecker, Poughkeepsie, N.Y.; Leonard T. Olson, Jericho, Vt.

[73] Assignee: International Business Machines Corporation, Armonk, N.Y.

[21] Appl. No.: 49,824

[22] Filed: Jun. 18, 1979

[51] Int. Cl.³ .............................................. H05K 7/20
[52] U.S. Cl. .................................. 361/386; 361/398; 361/399; 174/52 H; 357/81
[58] Field of Search ............... 361/412, 395, 399, 398, 361/386–389; 174/16 HS, 52 FP, 52 H; 357/49, 74, 75, 81; 339/17 CF, 17 F, 17 LM, 17 M

[56] References Cited

U.S. PATENT DOCUMENTS

| | | | |
|---|---|---|---|
| 3,011,379 | 12/1961 | Corwin | 84/1.19 |
| 3,082,327 | 3/1963 | Rice | 250/220 |
| 3,292,240 | 12/1966 | McNutt | 29/155.5 |
| 3,323,022 | 5/1967 | Da Costa | 361/412 |
| 3,325,882 | 6/1967 | Chiow | 29/155.5 |
| 3,363,146 | 1/1968 | Dijkmeijer | 361/412 |
| 3,487,541 | 1/1970 | Boswell | 29/626 |
| 3,544,857 | 12/1970 | Byrne | 317/234 R |
| 3,614,832 | 10/1971 | Chance | 29/626 |
| 3,662,230 | 5/1972 | Redwantz | 29/589 |
| 3,689,804 | 9/1972 | Ishihama | 361/386 |
| 3,757,175 | 9/1973 | Kim | 317/234 R |
| 3,780,352 | 12/1973 | Redwantz | 317/234 F |
| 3,781,596 | 12/1973 | Galli | 29/625 |
| 3,805,375 | 4/1974 | Lacombe | 29/577 |
| 3,911,327 | 10/1975 | Murari | 361/386 |
| 3,999,285 | 12/1976 | Lewis | 29/588 |
| 4,012,832 | 3/1977 | Crane | 29/575 |

OTHER PUBLICATIONS

IBM Tech. Discl. Bull., Vol. 21, No. 2, Jul. 1978, "Semiconductor Die With Wiring Skirt," Ecker and Olsen, p. 569.
IBM Tech. Discl. Bull., vol. 11, No. 3, Aug. 1968, p. 309, "Joining Semiconductor Chips . . . ", Kurtz.
IBM Tech. Discl. Bull., vol. 14, No. 10, Mar. 1972, p. 3090, "Multichip Packaging", Ehret, Haist, Spielmann.
IBM Tech. Discl. Bull., vol. 16, No. 3, Aug. 1973, p. 758, "Matched Expansion Chip Package", Van Vestrout.
IBM Tech. Discl. Bull., vol. 21, No. 11, Apr. 1979, p. 4425, "Processing PC Conductor Decals", Gazdik et al.
Module Package, IBM Tech. Discl. Bulletin, Vol. 18, No. 11, Apr. 1976, p. 3591, by Auletta.

Primary Examiner—Gerald P. Tolin
Attorney, Agent, or Firm—Wesley De Bruin

[57] ABSTRACT

Disclosed is a packaging structure wherein one or more integrated circuit semiconductor chips are mounted on membrane-like insulating members. The membrane-like members provide multilevel wiring and interconnection between the chip or chips and a secondary wiring structure. The packaging structure includes a module protective cap (preferably metal) and resilient means supported by said secondary wiring structure. The resilient means physically biases the semiconductor chip or chips against the module protective cap and also accommodate induced chip motion and variation. The packaging structure provides enhanced thermal, mechanical and electrical characteristics.

5 Claims, 8 Drawing Figures

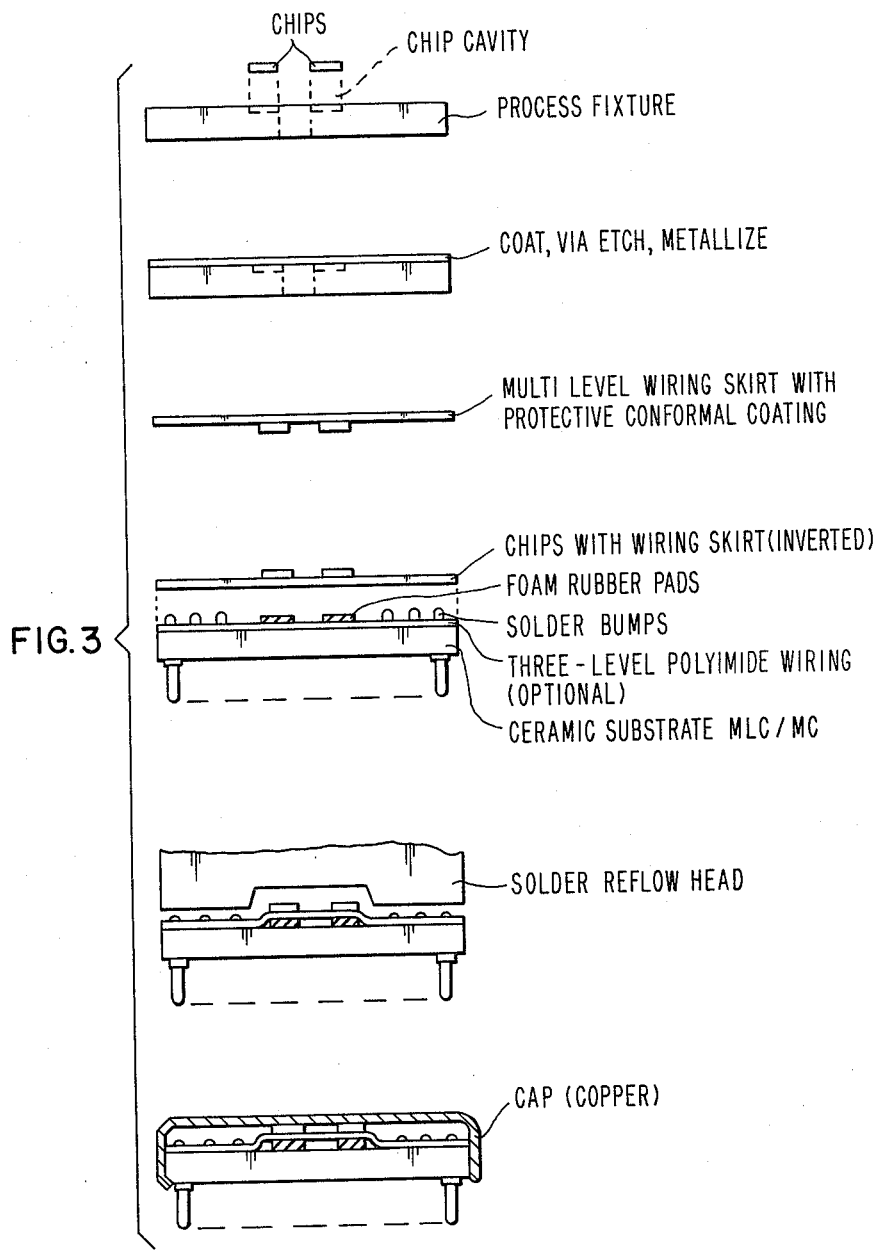

INTEGRATED CIRCUIT PACKAGE

FIELD OF THE INVENTION

The invention relates to integrated circuit semiconductor chips and more particularly, to improved packaging for one, two or more integrated circuit chips. The improved packaging structure utilizes at least one (thin membrane) wiring skirt in conjunction with additional structure for efficiently interconnecting integrated circuits into an electrical system, such as a data processing system or memory. The package has improved thermal, mechanical and electrical parameters.

BACKGROUND OF THE INVENTION AND PRIOR ART

It is common practice to mount integrated circuit chips onto substrates carrying film circuits or printed circuits. In some cases the integrated circuit chip is mounted face upward—that is with its array of connection contact areas uppermost—and connection between the contact areas and conductor lands on the substrate is made by means of thin jumper wires which extend over the edges of the chip. See, e.g., U.S. Pat. Nos. 3,082,327 and 3,011,379.

In other cases—commonly referred to as "flip-chip"—the chip is mounted face downwards and its contact areas are bonded to respective conductor lands on the substrate. See e.g., U.S. Pat. No. 3,292,240.

A variety of methods have been used for joining the contact areas of the chip to the respective conductor lands or jumper wires. The chip may include an integrated circuit having a plurality of separate or structurally integrated transistors, diodes, resistors and capacitors formed in the monolithic body of semiconductor material. Problems common to many prior art structures where chips are mounted on a substrate is to achieve an assembly providing adequate cooling, ability to withstand thermal shock and mechanical forces.

Numerous integrated circuit packaging structures are known in the prior art. The following prior art patents, publications and summaries are submitted to generally represent the state of the prior art.

U.S. Pat. No. 3,325,882 entitled "Method for Forming Electrical Connections to a Solid State Device Including Electrical Packaging Arrangement Therefor" granted June 20, 1967 to C. Chiou et al.

U.S. Pat. No. 3,487,541 entitled "Printed Circuits" granted Jan. 6, 1970 to D. Boswell. The Boswell patent discloses a process for manufacturing a mounted semiconductor device assembly having a die of semiconductor material secured to a substrate with a set of contact fingers joining respective electrode contact areas on the die to corresponding conductor lands on the substrate, the fingers extending over and/or under the die.

U.S. Pat. No. 3,544,857 entitled "Integrated Circuit Assembly with Lead Structure and Method" granted Dec. 1, 1970 to R. C. Byrne et al. The integrated circuit assembly with lead structure consists of a semiconductor body having at least portions of an electrical circuit formed therein and with contact pads carried by the body and lying in a common plane with leads carried by the body connecting the circuit to the pads. Support means is provided, at least a portion of which is formed of insulating material a plurality of spaced metallic leads are carried by the support means and are insulated from each other by the support means. The leads have contact areas arranged in a pattern lying in a common plane. A plurality of connecting elements of thin metallic film are in direct and intimate contact with the contact pads whereby the thin film connecting elements form the sole means for making electrical contact between the leads and the contact pads so that electrical contact may be made to the portions of the electrical circuit through the leads. In certain embodiments of the Byrne et al patent the connecting elements are carried by a flexible plastic tab or member.

U.S. Pat. No. 3,614,832 entitled "Decal Connectors and Methods of Forming Decal Connections to Solid State Devices" granted Oct. 26, 1971 D. A. Chance et al. A plurality of connections from electrically conductive lands on an insulating substrate to the contacts of a solid state device are formed in one operation by fixedly positioning the device on, or in a cavity within, the substrate. A decal, including a backing plate with a plurality of conductive strips which can be adhered to the plate by means of a soluble adhesive, is positioned over the device bearing substrate with the strips in registry with respective contacts and lands. The strips are brought into contact with respective contact and land surface portions and subjected to heat and pressure sufficient to cause bonding therebetween. Thereafter, the decal backing plate may be removed from the strips, as by dissolving the adhesive, leaving the strips firmly bonded to the contacts and lands and bridging the space therebetween, whereby the lands are connected to the contacts through the strips.

U.S. Pat. No. 3,662,230 entitled "A Semiconductor Interconnecting System Using Conductive Patterns Bonded to Thin Flexible Insulating Films" granted May 9, 1972 to J. O. Redwantz. The Redwantz patent discloses packaging system for one or more semiconductor chips each having metal contact pads on at least one face. A rigid support is provided for the semiconductor chip and also the large leads which are used to connect the packaged device in an external circuit. A set of thin metallic film strips are bonded to a thin flexible dielectric sheet for support. The set of metal strips interconnects the contact pads on the semiconductor chips and selected leads to electrically interconnect the semiconductor device and the leads. Where a plurality of semiconductor devices are used, a plurality of dielectric sheets can be stacked and electrical connections made between the different layers of metal film strips through openings in the dielectric sheets. Several processes for assembling the packages are also described.

U.S. Pat. No. 3,757,175 entitled "Composite Integrated Circuits with Coplanar Connections to Semiconductor Chips Mounted on a Single Substrate" granted Sept. 4, 1973 to C. S. Kim et al. The Kim et al patent discloses a structure which includes a rigid dielectric substrate for supporting a number of semiconductor chips having metallized contact electrodes and an insulating material overlaying one surface of the substrate in which material said chips are embedded. The substrate further supports conductor strips having terminal electrodes intended to be connected to said contact electrodes. The chips are bonded to the substrate with said contact electrodes in registry with said terminal electrodes and with the contact and terminal electrodes contiguous with the surface of said insulating material. Metallization deposited on the surface of the insulating material extending between the contact and terminal electrodes forms electrical connections to the chips.

U.S. Pat. No. 3,780,352 entitled "Semiconductor Interconnecting System Using Conductive Patterns Bonded to Thin Flexible Insulating Films" granted Dec. 18, 1973 to J. O. Redwantz. The Redwantz patent discloses a packaging system for one or more semiconductor chips each having metal contact pads on at least one face. A rigid support is provided for the semiconductor chip and also the large leads which are used to connect the packaged device in an external circuit. A set of thin metallic film strips are bonded to a thin flexible dielectric sheet for support. The set of metal strips interconnect the contact pads on the semiconductor chips and selected leads to electrically interconnect the semiconductor device and the leads. Where a plurality of semiconductor devices are used a plurality of dielectric sheets can be stacked and electrical connections made between the different layers of metal film strips through openings in the dielectric sheets. Processes for assembling the packages are also described.

U.S. Pat. No. 3,781,596 entitled "Semiconductor Chip Carriers and Strips Thereof" granted Dec. 25, 1973 to R. J. Galli et al. The Galli et al patent discloses "a method of interconnecting semiconductor chips to the circuitry of a substrate package by means of a flexible transparent carrier". The carrier is composed of a film base upon which there is a pattern of discretionary conductors and bonding pads. The film serves as a supporting layer for the conductor pattern which is applied to one surface thereof by selective deposition and/or etching of coatings and raised contact areas. Chips are mounted so that the active chip surface is bonded to the carrier pads, and thereafter connected to the circuitry of the substrate by the discretionary carrier conductor pattern. The carrier pads localized the bonding contact area for reliable bonding and raise the carrier conductors of the active surface of the chip to prevent shorting. The optional registration holes of the carrier film provide means for accurate alignment of chips and carrier contact area.

U.S. Pat. No. 3,805,375 entitled "Composite Integrated Circuits Including Semiconductor Chips Mounted on A Common Substrate with Connections Made Through A Dielectric Encapsulator" granted Apr. 23, 1974 to D. J. La Combe et al. The La Combe et al patent discloses a structure which includes a rigid dielectric substrate for supporting a number of integrated circuit semiconductor chips having metallized contact electrodes on one or more faces thereof. The substrate further supports conductor strips having terminal electrodes intended to be connected to said contact electrodes. The chips are bonded to the substrate with said contact electrodes in registry with said terminal electrodes. An encapsulating dielectric material overlays said substrate and semiconductor chips. Openings are formed within said dielectric material which are in alignment with said contact and terminal electrodes. Metallization deposited on the surface of said dielectric material enters said openings and makes electrical connection between the conductor strips on said substrate and the semiconductor chips.

U.S. Pat. No. 3,999,285 entitled "Semiconductor Device Package" granted June 30, 1975 to T. E. Lewis et al. The Lewis et al patent is directed to an integrated circuit semiconductor device package and a method of making it. A woven fiber mat impregnated with an epoxy adhesive serves as a first housing member. It includes an opening therein for receiving an integrated circuit semiconductor device. The housing member is placed on a supporting heat sink and a lead frame placed on top of the housing member. This sub assembly is heated to bond the elements together by curing the epoxy adhesive in the first housing member. A second housing member is then placed over the lead frame. The second housing member includes an opening therein which is slightly larger than the opening in the first housing member. A lid is placed on top of the second housing member to cover the opening after the semiconductor device has been bonded to the substrate within the openings in the housing members. The assembly is then heated to bond the remaining elements together with the epoxy adhesive in the second housing member to form a completed package.

U.S. Pat. No. 4,012,832 entitled "Method for Non-Destructive Removal of Semiconductor Devices" granted Mar. 22, 1977 to J. R. Crane. Semiconductor devices having a conductive lead pattern on the bottom of the device are bonded to conductive pads on a substrate to form an electrical connection therewith. The connection comprises two layers of conductive adhesive plastic separated by a small chip of conductive alloy which melts above the curing temperature of the adhesive plastic. The non-destructive removal of a semiconductor device from the substrate is accomplished by heating only the semiconductor device to be removed until the alloy chip under the device melts, thus, permitting the non-destructive removal of the semiconductor device without the application of force which would tend to destroy the semiconductor device.

Reference is made to the following IBM Technical Disclosure Bulletin Publications:

"Joining Semiconductor Chips to A Decal Interconnection Overlay" by F. J. Kurtz, Vol. 11, No. 3, August 1968, page 309; "Multichip Packaging" by P. Ehret et al., Vol. 14, No. 10, March 1972, page 3090; 137 Matched Expansion Chip Package" by V. D. Van Vestrout, Vol. 16, No. 3, August 1973, page 758; and "Processing PC Conductor Decals" by C. E. Gazdik et al., Vol. 21, No. 11, April 1979, page 4425. The immediately foregoing publication discloses the flip-chip bonding of semiconductor chips to thin flexible polyimide substrates or printed circuit decals.

Reference is made to the IBM Technical Disclosure Bulletin publication entitled "Semiconductor Die with Wiring Skirt (Packaging Structure)" by M. Ecker and L. Olson, Vol. 21, No. 2, July 1978. This publication, by the applicants' of this application, discloses the structure disclosed and claimed herein.

The invention may be summarized as an improved packaging structure wherein one or more integrated circuit chips are mounted on membrane-like insulating members. The membrane-like members provide multi-level wiring and interconnection between the chip or chips and a secondary wiring structure. The packaging structure includes a module protective cap (preferably metal) and resilient means supported by said secondary wiring structure. The resilient means physically biases the semiconductor chip or chips against the module protective cap and also accommodates induced chip motion and variation. The packaging structure provides enhanced thermal, mechanical and electrical characteristics.

The primary object of the invention is an improved integrated circuit chip packaging structure having enhanced thermal, mechanical and electrical characteristics.

BRIEF DESCRIPTION OF THE DRAWINGS

FIG. 3 illustrates a process sequence for fabricating an improved integrated circuit packaging structure in accordance with the invention.

DISCLOSURE OF THE INVENTION

A number of techniques and structures for effecting a thermal path between a semiconductor chip and its metallic protective enclosure are known in the art. In the known chip-joining technique employing controlled collapse solder reflow, these various thermal coupling means (such as wire mesh, indium dot, liquid metal, etc.,) must have inherent resiliency or compensatory means for accommodation of expansivity differentials and mechanically induced deflection of the thermal coupling means. Further, these various devices must provide for corrosion protection and creep rate control for the chip-to-substrate solder connection.

Figure 1A:
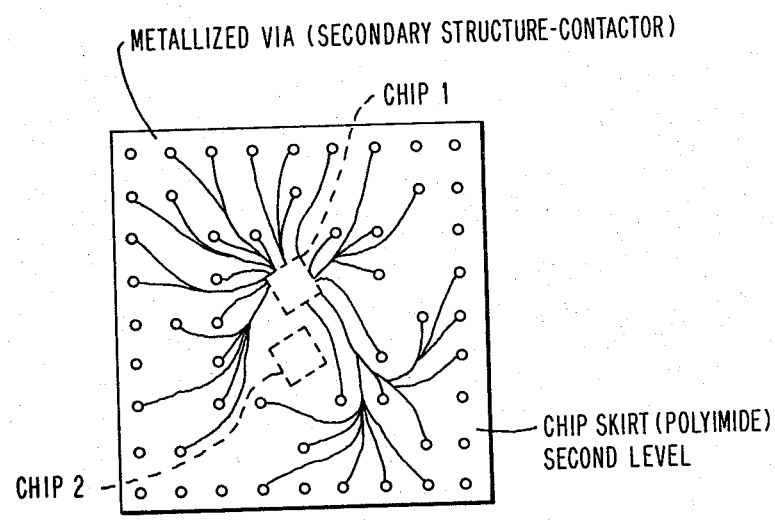
FIG. 1A illustrates, in accordance with the invention, two integrated circuit chips attached (connected) to the far side of an insulating membrane.

Reference is made to FIGS. 1A through 1D for an example of a number of possible embodiments. FIG. 1A depicts a thin insulating membrane, such as polyimide, parylene or other suitable materials, attached to the device side of two chips with predetermined relative separation.

FIG. 1A illustrates the two chips attached to the far side of the insulating membrane. The employment of photoresist and etching produces openings in the membrane over the active area of chip #1. The openings effected correspond to metal contacts on chip #1. Other openings are similarly effected to agree with a contact grid of a secondary support structure, such as a chip carrier. By masking and metal deposition, metallic lands are provided as electrical paths between the openings over chip #1 and the openings for the secondary structure contact grid.

The configuration of FIG. 1A is then coated with a thin layer of the membrane material and similarly processed to provide connections between the contacts on chip #2 and the identical set of openings in the secondary structure contact grid. FIG. 1C illustrates the second-level metallic pattern for chip #2. At this stage what is accomplished is the interconnection of two identical memory chips to a common set of contact openings in a predetermined format, but both levels of metal lands are appropriately insulated from one another. A final conformal coating is applied to the membrane to provide environmental isolation for all metallic surface elements except for regions around the openings for the secondary structure contact grid. The two chips with the common membrane skirt are now ready for assembly to the secondary structure of FIG. 1B.

Figure 1B:
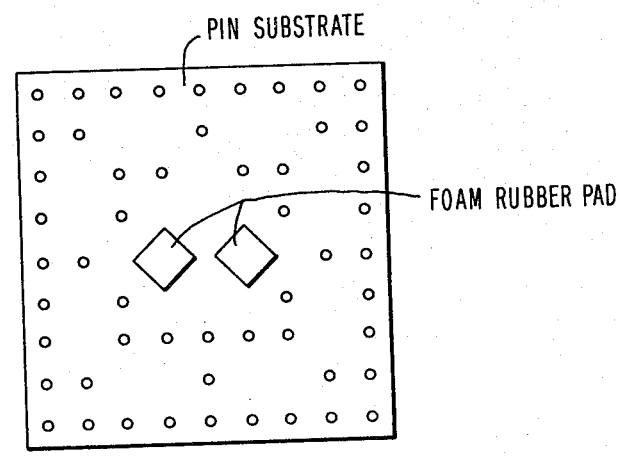
FIG. 1B illustrates, in accordance with the invention, the upper surface of the secondary wiring structure (chip carrier, such as a ceramic module).
Figure 1C:
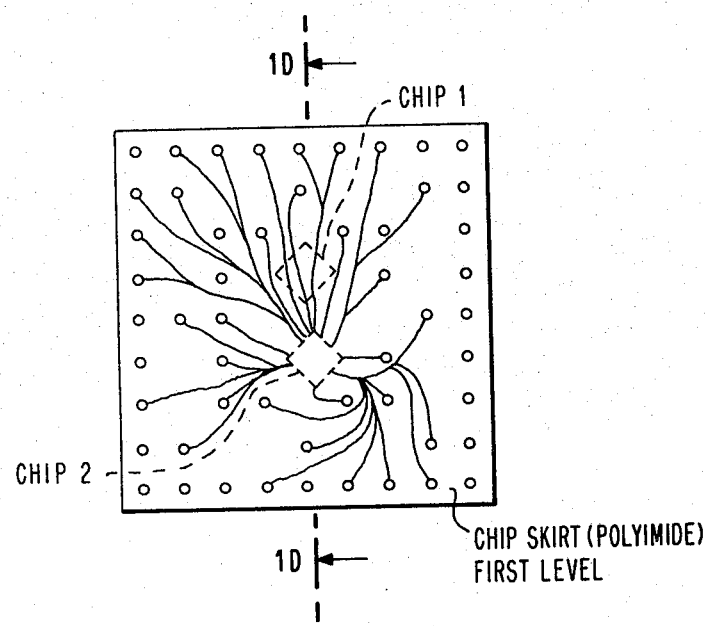
FIG. 1C illustrates, in accordance with the invention, the second-level metal pattern for chip #2.

The secondary structure of FIG. 1B is the top surface of a chip carrier, such as a ceramic module. The configurations of uniformly spaced circles are representative of metallic protrusions above the module surface and agree with the spacing of the openings on the chip wiring skirt. A pair of foam rubber pads, or other suitable material having the appropriate resiliency, is bonded to the substrate surface so as to register with the relative position of chips 1 and 2.

Figure 1D:
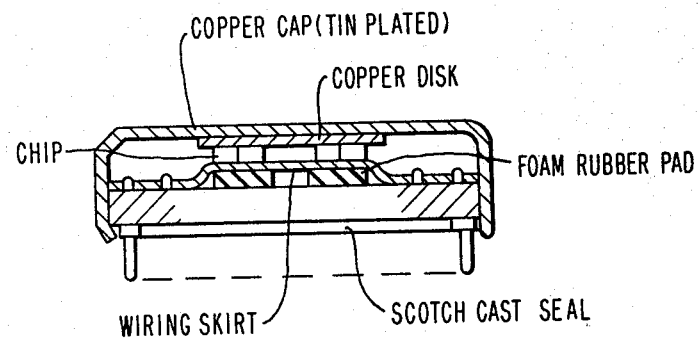
FIG. 1D illustrates, in accordance with the invention, a cross sectional view (line 1D—1D of FIG. 1C) of a packaging structure in accordance with the invention.

FIG. 1D illustrates a cross section of the completed module assembly. The membrane skirt is shown connected to the protrusions on the module surface. These protrusions are in turn, connected directly or through vias to the appropriate pins on the underside of the module. The assembly of the copper cap slightly compresses the chips into the foam rubber pads. The crimping of the cap about the module allows the chips to be in direct contact with the inside surface of the cap. Any induced deflection of the top surface of the cap is absorbed by a corresponding deflection in the foam rubber pads. If the semiconductor chip must be electrically isolated from the cap, a thin dielectric coating may be deposited on the cap inner surface.

Figure 2A:
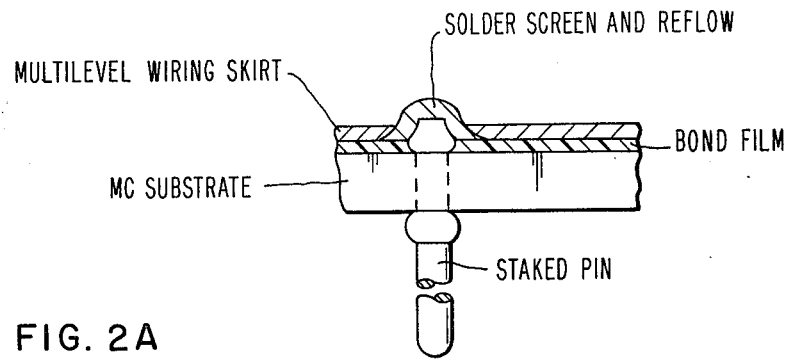
FIGS. 2A, 2B, and 2C respectively depict structural techniques for connecting the wiring skirt to the secondary contact grid.
Figure 2B:
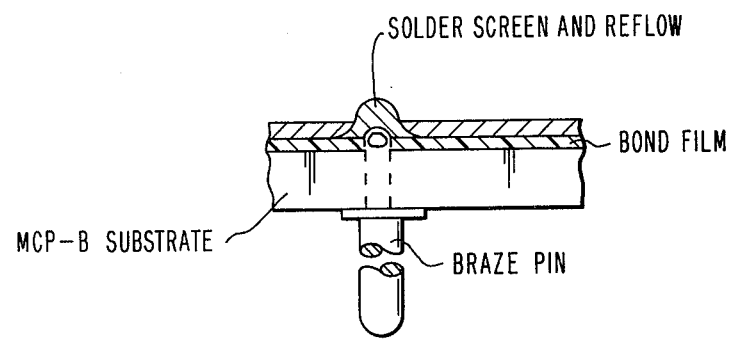
Figure 2C:
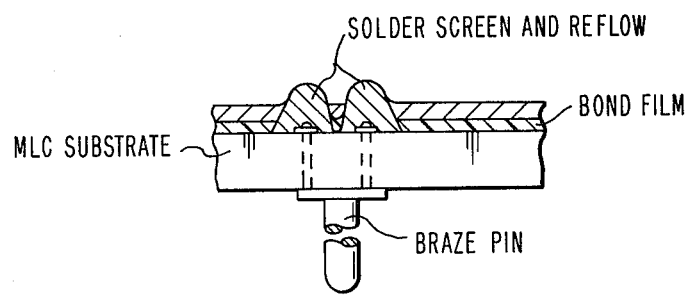

FIGS. 2A through 2C depict some of a number of ways that the wiring skirt may be connected to the secondary contact grid.

Typically, a polyimide bond film is suitably punched and placed between the wiring skirt and the module surface. Under pressure and temperature the bond film effects the attachment of the skirt to the module surface. The corresponding metallized openings in the wiring skirt are larger than the protrusions to be connected to on the module. Solder paste is then screened over the openings and reflowed to effect connections between the module and the wiring skirt.

FIG. 2A illustrates the connection of a wiring skirt to a staked pin in a metallized ceramic (MC) module. FIG. 2B depicts the wiring skirt connection to a metal protrusion on a via of a multilayer ceramic (MCP-B). FIG. 2C shows a similar connection to an MLC having clustered vias as well as three layers of supplemental wiring on its top surface.

FIG. 3 illustrates a possible process sequence for effecting the embodiment described in this article.

This embodiment provided a doubling of memory capability on a given module size and maintained plug compatibility as well as higher thermal dissipation capability. It is apparent that other applications employing more chips, multiple groups of skirts and different module designs can be effected to advantage.

While the invention has been particularly shown and described with reference to the preferred embodiments thereof, it will be understood by those skilled in the art that various changes in form and detail may be made therein without departing from the spirit and scope of the invention.

Having thus described my invention, what we claim as new, and desire to secure by Letters Patent is:

1. An improved integrated circuit chip packaging structure, said structure comprising:
   an integrated circuit chip having an array of electrical contacts;
   a wiring structure having an array of electrical contacts;
   a thin flexible membrane-like insulating member containing a wiring pattern, said wiring pattern of said membrane-like insulating member interconnecting said array of electrical contacts of said integrated circuit chip and said array of contacts of said wiring structure;

a protective cover supported by said wiring structure and enclosing said integrated chip and said thin flexible membrane-like insulating member;

and resilient means, spaced between said wiring structure and said membrane-like member, for biasing said integrated circuit chip in physical contact with said protective cover, whereby the thermal and mechanical parameters of said packaging structure are enhanced.

2. An improved integrated circuit chip packaging structure, said structure comprising:

a plurality of integrated circuit chips, each of said integrated circuit chips having an array of electrical contacts;

a wiring structure having an array of electrical contacts;

a thin flexible membrane-like insulating member containing a wiring pattern, said wiring pattern of said membrane-like insulating member electrically interconnecting said arrays of electrical contacts of said integrated circuit chips and said array of contacts of said wiring structure;

a thermally conductive protective cover supported by said wiring structure and enclosing said integrated chips and said thin flexible membrane-like insulating member;

and resilient means, spaced between said wiring structure and said membrane-like member, for biasing said integrated circuit chips into physical contact with said protective cover, whereby the thermal and mechanical parameters of said packaging structure are enhanced.

3. An improved integrated circuit chip packaging structure as recited in claims 1 or 2 wherein said wiring structure is a pinned substrate.

4. An improved integrated circuit chip packaging structure as recited in claims 1 or 2 wherein said wiring structure is a metallized ceramic structure and said array of contacts of said wiring structure is provided by a plurality of staked connection pins within said ceramic structure.

5. An improved integrated circuit chip packaging module, said module comprising:

an integrated circuit chip having at least first and second generally planar surfaces, an array of electrical contacts residing on said second planar surface of said chip for providing input/output connections to the integrated circuitry of said chip;

a substrate formed of electrically insulating material, said substrate having at least first and second generally planar surfaces, said first planar surface of said substrate containing an array of electrical contacts, a plurality of elongated connection pins extending from said second planar surface of said substrate, and connection means contained within said substrate for selectively connecting said array of electrical contacts of said substrate to said plurality of elongated connection pins;

a sheet of thin flexible insulating material containing a wiring pattern, said wiring pattern of said thin flexible insulating material electrically interconnecting said array of electrical contacts residing on said second planar surface of said chip with said array of electrical contacts residing on said first planar surface of said substrate;

a protective cover formed of thermally conductive material, said protective cover being supported by said substrate and enclosing said integrated circuit chip and said thin flexible insulating material;

and resilient means, spaced between said first planar surface of said substrate and said sheet of thin flexible insulating material, said resilient means biasing said first planar surface of said chip in physical contact with said protective cover, whereby the thermal and mechanical parameters of said packaging module are enhanced.

* * * * *